INVENTORS
PAUL L. BARON
RAYMOND W. HAMAKER
ANGELO T. ROMEO
BY Paul D. Carmichael
ATTORNEY

United States Patent Office 3,181,979

Patented May 4, 1965

3,181,979

SEMICONDUCTOR DEVICE

Paul L. Baron, Owego, Raymond W. Hamaker, Barton, and Angelo T. Romeo, Binghamton, N.Y., assignors to International Business Machines Corporation, New York, N.Y., a corporation of New York Filed Dec. 18, 1961, Ser. No. 160,000

2 Claims. (Cl. 148—33.1)

The present invention relates generally to an improved semiconductor device and a method of making the same. Such a device has a crystalline body of electrically semiconducting substance subjected to electric or magnetic fields, to corpuscular or wave radiation or to a plurality of such phenomena for performing electrical, photoelectrical, optical or other physical effects. More particularly, the invention is concerned with a semiconductor device where the junction is provided by surface alloying a material on a host crystal.

One recently developed type of semiconductor is a diode which, when forward biased, has a negative resistance region in its characteristic voltage versus current curve. In such a diode, the regions of opposite conductivity type are degenerate or nearly degenerate and the junction is extremely narrow at the interface between these regions. The Fermi level is within or approaches the conduction band of the N-type region and the valence band of the P-type region. When the junction is forward biased, a significant portion of the forward current occurs by quantum-mechanical tunneling of the charge carries to the available states. Such a semiconductor device is known in the art as a tunnel diode in reference to the tunneling principle or an Esaki diode (see, for example, the article by L. Esaki, entitled "New Phenomenon in Narrow Germanium p-n junction," Physical Review, volume 109, pages 603 and 604, January 15, 1958).

The tunnel diode offers many advantages in switching applications. For example, when properly biased, a tunnel diode has two stable operating states disposed on opposite sides of the negative resistance region and can be switched rapidly between these points. The switching through the negative resistance region is a quantum-mechanical phenomenon and the speed of switching is theoretically limited only by the speed of light. The tunnel diode is also used in high frequency oscillatory circuits because of the negative resistance region in its characteristic curve.

Although the advantages of employing tunnel diodes in the above and other applications are widely recognized, the use of certain types of such diodes has in many cases been severly restricted due to the inability to fabricate acceptable devices on a production basis. Further, prior art devices having a particular semiconductor host have a definite tendency to deteriorate—evidenced by extreme reductions in the peak to valley current ratios—after short periods of operation. This is particularly true with respect to gallium arsenide tunnel diodes having current densities at the junction of approximately 500 amperes per square centimeter or above. Heretofore, it has not been possible to fabricate tunnel diodes from this material having high current densities at the junction which would not be degraded to an unacceptable level after a short period of normal operation.

Briefly, the present invention provides an improved semiconductor device and a method of making the same. The semiconductor device is provided by equilibrium dissolution of a portion of a degenerately doped or nearly degenerately doped semiconductor host crystal by an indium-copper alloy containing impurity materials of the opposite conductivity type and then non-equilibrium freezing to cause regrowth at the interface to establish a narrow junction and degenerate doping in the semiconductor. The carrier alloy comprises in the order of 5 to 15% of copper by weight and 95 to 85% indium by weight and impurity materials of several percent by weight. For a P-type semiconductor host crystal, the N-type impurities are provided by mixing traces of certain Group VI elements of the periodic table (sulphur, selenium and/or tellurium) with the carrier alloy. In accordance with one embodiment of the invention, the junction is established in a P-type gallium arsenide host crystal which is heavily doped with zinc by a combination of the N-type dopants sulphur, selenium and tellurium. The carrier-dopant alloy is approximately 90% by weight indium, 10% by weight copper and a trace (approximately one percent by weight) of each of the impurity materials sulphur, selenium and tellurium, that is, an amount sufficient to accomplish degeneracy in the alloy. A highly simplified process is provided for the fabrication of such tunnel diodes.

It is an object of the invention to provide tunnel diodes having very high current densities and large peak to valley current ratios. Such tunnel diodes are required in certain applications as will be understood by those skilled in the art. Gallium arsenide tunnel diodes having current densities in excess of several thousand amperes per square centimeter and peak to valley ratios greater than forty to one have been fabricated in accordance with the teachings of the present invention.

Another object of the invention is to provide tunnel diodes of the type set forth in the above object which do not fail during normal operation thereof. A significant percentage of the gallium arsenide tunnel diodes maintain their original peak to valley ratios over extremely long operating periods.

Yet another object of the invention is to provide a method of fabricating tunnel diodes wherein the same may be produced in quantities on a production basis.

A further object of the invention is to provide tunnel diodes having improved junctions and means for controlling the junctions. The indium-copper carrier alloy (approximately 90% indium and 10% copper) controls the wetting of the doped gallium arsenide host crystal and produces substantially less crystal strains and other imperfections in the junctions.

Yet a further object of the invention is to provide tunnel diodes having P-type semiconductor host crystals where the N-type dopant materials are sulphur, selenium and tellurium. The impurity materials provide maximum degeneracy without causing secondary tunneling effects in the gallium arsenide host crystal.

A still further object of this invention is to provide a method for fabricating tunnel diodes of the type described in the above objects. The indium-copper carrier alloy allows the use of a highly simplified time-temperature cycle and simple production apparatus.

The foregoing and other objects, features and advantages of the invention will be apparent from the following more particular description of a preferred embodiment of the invention, as illustrated in the accompanying drawings.

Figure 1:
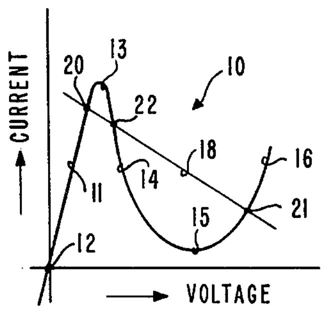
FIGURE 1 is a graphical illustration of the resultant characteristic voltage versus current curve of a tunnel diode.

Referring now to the drawings and initially to FIGURE 1 thereof, there is shown a typical characteristic curve 10 of forward voltage versus forward current for a tunnel diode. The curve comprises a substantially linear and positive resistance portion 11 extending between the origin 12 and a peak 13, a negative resistance region 14 between the peak 13 and a valley area 15, and a rising positive resistance region 16 to the right of the valley area 15. A resistive load line 18 is superimposed on the characteristic curve and intersects the same at points 20 and 21 in the positive resistance regions 11 and 16, respectively, and point 22 in the negative resistance region 14. The latter point is unstable so that when the current is increased above the peak 13, the tunnel diode immediately switches to its second stable or high voltage state 21. This type of operation is widely employed in switching circuit applications.

Figure 2:
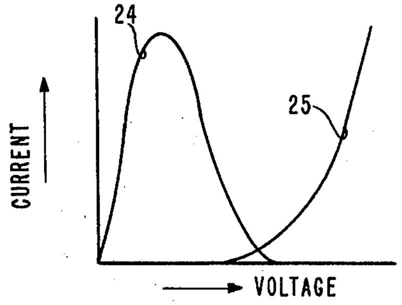
FIGURE 2 is a graphical illustration of voltage versus current curves indicating the tunneling and diffusion currents which define the resultant characteristic curve shown in FIGURE 1.

The positive resistance region 11 and the negative resistance region 14 are provided primarily by the tunneling current as represented by curve 24 in FIGURE 2 of the drawings. The Zener current and the primary tunneling current are of equal and opposite magnitude at the origin. The primary tunneling current rises sharply with increases in the applied voltage until the peak of the primary tunneling current is reached; while the Zener current decreases rapidly with increases in the applied voltage and is neglected herein. Thereafter, the primary tunneling current decreases as the applied voltage is increased and eventually diminishes to zero. The diffusion current is shown by curve 25 and is primarily responsible for providing the positive resistance region 16. The valley area 15 is generally considered to result from the sum of the greatly diminished tunneling current, diffusion current and excess current. The resultant characteristic curve 10 of the tunnel diode is the summation of the curves 24 and 25.

In the fabrication of tunnel diodes, it is known to use various types of semiconductor host crystals. A germanium host crystal is probably the most widely employed due to the relative stability of the resultant tunnel diodes during normal operations and the relative ease of fabrication. However, other semiconductor host crystals offer advantages in certain applications. A gallium arsenide host crystal has a wider band gap than a germanium host crystal at room temperature (1.35 electron volts as compared with .7 electron volt). The valley area of a tunnel diode using a gallium arsenide host crystal is much wider than the valley area of a similar tunnel diode employing a germanium host crystal because of a lower diffusion current density. As a result, a wider voltage switching range is provided in the case of the gallium arsenide tunnel diode.

The dielectric constant of gallium arsenide is substantially lower than the dielectric constant of germanium. A tunnel diode formed from a gallium arsenide host crystal will have considerably less internal capacitance than a tunnel diode of the same junction width and cross-sectional area employing a germanium host crystal. Tunnel diodes are sensitive to changes in environmental conditions, such as increases in temperature. A temperature increase will cause the second positive resistance region to rise toward the first positive resistance region and a decrease in the width of the valley area since the diffusion current density is temperature dependent. A tunnel diode formed from a gallium arsenide host crystal will better withstand such environmental changes because the initial current density is less than that for a germanium tunnel diode considering equal rates of change of the diffusion currents as a function of increased temperature.

The peak to valley current ratio is conventionally employed to define the gain of a tunnel diode. This ratio is obtained by dividing the peak current (point 13) by the valley current (point 15). Large peak to valley current ratios are desirable since the same are related to the driving and powering capabilities of circuits employing tunnel diodes. Another measure of a tunnel diode is the current density at the junction which is obtained by dividing the peak current by the cross-sectional area of the junction. Heretofore, it has been impossible to fabricate tunnel diodes using gallium arsenide host crystals in acceptable quantities on a production basis and having current densities at the junctions above approximately 500 amperes per square centimeter. Tunnel diodes having higher current densities and fabricated in accordance with prior art teachings fail after short time intervals of normal operation. The failure is evidenced by drastic reductions in the peak to valley current ratios through changes in both the peak and valley regions of the characteristic curves.

In accordance with the teachings of the invention, a gallium arsenide crystal is doped by standard techniques with a P-type dopant. The P-type dopant many be zinc or certain other elements from Group II of the periodic table such as magnesium or cadmium. In one embodiment of the invention, a gallium arsenide crystal was doped with zinc to obtain carrier concentrations of approximately $5 \times 10^{19}$ carriers per cubic centimeter using sealed ampoule vapor phase doping techniques, which carrier concentration is believed to be the lower limit necessary for obtaining a tunnel diode. The crystal has a thickness of ten to twenty mils and is cut into square wafers about forty by forty mil size. One major exposed surface of each wafer is electrolytically etched with a potassium hydroxide solution to permit ready and controlled wetting of the crystal by the carrier-dopant alloy.

The carrier-dopant alloy is provided by mixing approximately 90% indium and 10% copper by weight with traces of the impurity materials sulphur, selenium and tellurium. This mixing can be accomplished by heating the elements in an inert atmosphere using a quartz crucible with rapid non-equilibrium freezing of the molten solution. The impurity elements each comprise approximately one percent by weight of the resultant carrier-dopant alloy.

Figures 3, 4:
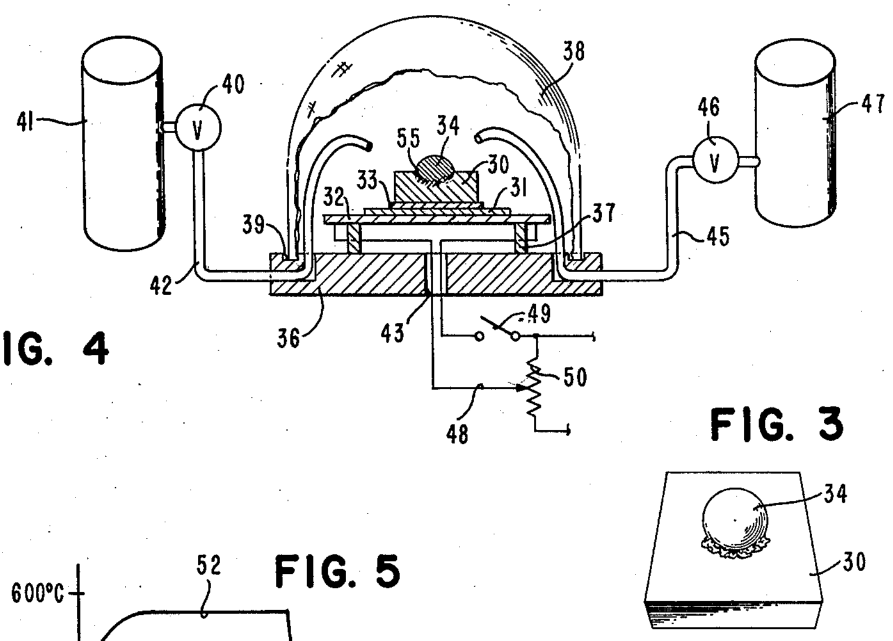
FIGURE 3 is an illustration of the spherical nature of the carrier-dopant alloy and its relationship to the semiconductor host crystal at the beginning of a fabricating operation.
FIGURE 4 is a cross-sectional view showing the junction established in the semiconductor host crystal and the equipment utilized during the fabricating operation.

To fabricate a tunnel diode, one of the wafer-like zinc doped gallium arsenide crystals 30 is attached to a nickel strip 31 by a layer of solder 33. The nickel strip 31 is then placed in overlying relation with a tungsten heating element 32. The heating element 32 forms a portion of the alloying apparatus shown in FIGURE 4 of the drawings. A small chunk of the carrier-dopant alloy 34 is then positioned on the exposed and etched major surface area of the host crystal 30.

The tungsten heating element 32 is mounted from a supporting base 36 by standoff insulators 37. A glass cover 38 rests on supporting base 36 in slot 39 and defines a chamber enclosing the host crystal and the carrier-dopant alloy. An inert atmosphere is established in the chamber during a fabricating operation by opening valve 40 to permit an inert gas, such as nitrogen, to flow from a reservoir 41 through a conduit 42 and into the chamber. The gas is permitted to flow for an interval prior to the heating cycle to remove most of the air from the chamber via an opening 43.

A second conduit 45 also leads into the chamber and is connected via valve 46 to a source 47 of a coolant, such as liquid nitrogen, for example. As will be hereinafter more fully explained, the cold nitrogen gas issuing from conduit 45 is used to rapidly freeze the liquidus to cause the formation of a narrow tunnel diode junction. Alternately, or in combination, a heat sink, not particularly shown, can be positioned in contact with the tungsten heating element 32.

The heating element 32 is connected by conductors 48 extending through the opening 43 to a switch 49 and an adjustable source of electrical energy represented schematically by potentiometer 50. When the switch 49 is closed, the tungsten heating element becomes hot, thereby raising the temperature of the host crystal and melting the carrier-dopant alloy to cause controlled equilibrium dissolution of the gallium arsenide host crystal in the liquid carrier-dopant alloy.

After the host crystal 30 and the chunk of the carrier-dopant alloy 34 have been positioned within the chamber of the alloying apparatus, valve 40 is opened and an inert atmosphere is established in the chamber. The switch 49 is closed and a heating cycle is initiated by slowly increasing the power supplied (accomplished by appropriate adjustment of the center tap of potentiometer 50) to the tungsten heating element 32. The carrier-dopant alloy 34 is heated to its molten or liquid state and becomes spherical in shape. The carrier-dopant alloy is raised to a temperature such that sufficient wetting of the gallium arsenide host crystal takes place. The appearance of the assembly at the beginning of wetting is diagrammatically illustrated in FIGURE 3 of the drawings.

Figure 5:
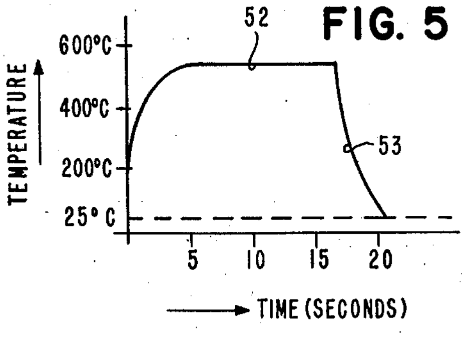
FIGURE 5 is a temperature versus time curve illustrating the heating and cooling cycle used in providing tunnel diodes.

Heating is continued at a constant rate for several seconds to obtain equilibrium dissolution of the gallium arsenide host crystal in the carrier-dopant alloy. A time versus temperature curve 52 illustrating the above operation is depicted in FIGURE 5 of the drawings. The time-temperature cycle is determined experimentally and the maximum temperature is sufficient to cause melting of the carrier-dopant alloy. The book by Dr. Max Hansen entitled "Constitution of Binary Alloys," and published in 1958 by the McGraw-Hill Book Company, Inc., New York, New York, presents and discusses a phase diagram for the copper-indium alloy system on pages 590–592. This phase diagram indicates that the slope of the liquidus curve is relatively steep over the range of 85 to 95% indium by weight for the copper-indium alloy system. For a 5% concentration of copper by weight, the melting point is about 450° C., for a 10% concentration approximately 500° C. and for a 15% concentration about 550° C. Phase diagrams for alloy systems employing combinations of the various materials used in the host crystal and carrier-dopant alloy in accordance with the teachings of the present invention are also presented in this book. The above-mentioned temperatures are representative of the order of magnitude of the temperatures required to melt the dopant-carrier alloy.

The melting point of the carrier-dopant alloy system (comprising in the range of 5–15% copper, 85–95% indium and traces of the dopants sulphur, selenium and tellurium) is above 400° C. and controlled dissolution of the gallium arsenide host crystal occurs within this temperature range. Such a carrier-dopant alloy provides improved wetting and equilibrium dissolution of the gallium arsenide host crystal. A carrier-dopant alloy containing less than 5% copper by weight is quite soft and has a relatively low melting point. Uncontrolled wetting of the host crystal takes place in that the alloy spreads unevenly over the surface of the host crystal and does not penetrate the same. The junction is very soft and easily deformed, causing connection difficulties.

Conversely, when more than approximately 15% by weight of copper is employed, the carrier-dopant alloy is quite brittle and the electrical connections are easily damaged. The melting temperature of the carrier-dopant alloy is so high that the host crystal may be damaged. Examination of the junctions of tunnel diodes fabricated in acordance with the teachings of this invention has shown the same to be relatively free from substrate cracking and other crystal strains which may result in "hot spots" during normal operations. The term "hot spots" is used to designate imperfections in a junction where the current density becomes excessive and may cause failure of the semi-conductor device.

As previously mentioned, the temperature is maintained at a relative constant level for a short time interval so that an equilibrium condition is established with the gallium arsenide host crystal being dissolved in the liquidus carrier-dopant alloy. This time interval is represented as being approximately ten seconds in the illustrated embodiment of the invention.

After the equilibrium condition has been established, the valve 46 and the switch 49 are opened so that the interface between the host crystal and the carrier-dopant alloy is rapidly cooled as represented by portion 53 of time-temperature curve 52. The rapid freezing of the liquidus causes a narrow tunnel diode junction 55 to be formed as represented schematically in FIGURE 4 of the drawings. The more rapid the cooling, the faster the recrystallization of the gallium arsenide takes place at the interface and the narrower the resultant junction. A more complete explanation of this is contained in co-pending application Serial No. 104,054, filed April 19, 1961, entitled "Tunnel Diode and Process Therefor," which is assigned to the assignee of the present invention. Practically, the rate of interface cooling must not be so great that undesirable mechanical strains take place at the junction. The proper rate of interface cooling is readily determined by experiment through measurement of the resultant tunnel diode operational characteristics and examining sections of individual junctions.

The carrier-dopant alloy 34 and the host crystal 30 are separated by the planer junction 55 established in accordance with the above-described process. The tunned diode is removed from the heating element 32 and, in a manner not shown, the junction 55 is electrolytically etched by conventional techniques to enhance the tunnel diode characteristics. The solidified indium rich alloy is utilized as an ohmic contact for the regrown N-type layer. Electrical connections are easily made by soldering leads to the alloy.

Tunnel diodes fabricated in accordance with the above teachings have been found to have substantially higher current densities and peak to valley ratios than similar semiconductor devices manufactured in accordance with prior art processes. Also, these tunnel diodes are subject to much less deterioration of diode characteristics under prolonged and normal operation. Tunnel diodes have been fabricated having average peak to valley current ratios greater than forty to one and current densities of several thousand amperes per square centimeter.

Figure 6:
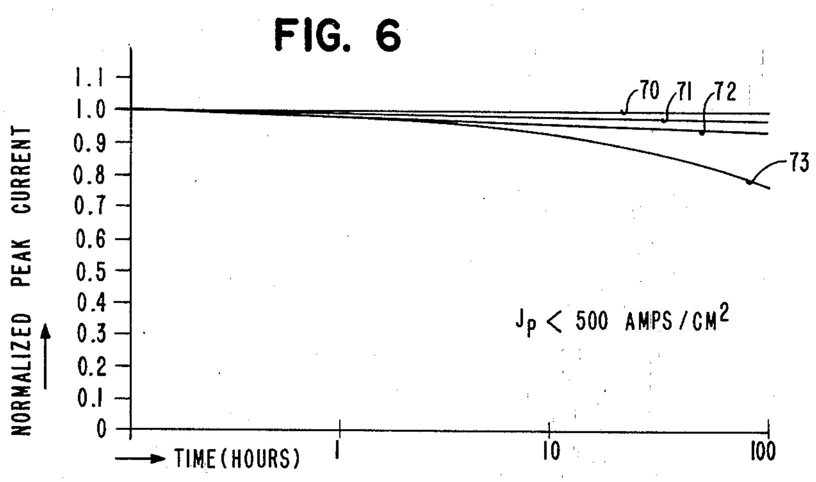
FIGURES 6–8 are graphs indicating the degradation of peak current with respect to operating time for tunnel diodes fabricated in accordance with the teachings of the invention.
Figure 7:
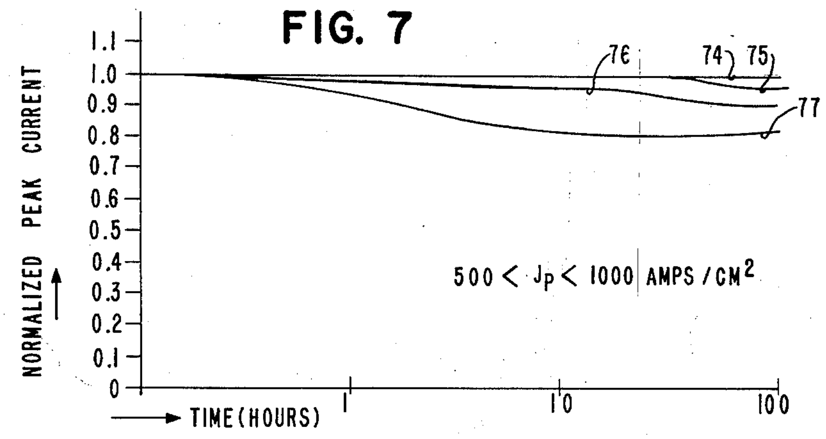
Figure 8:
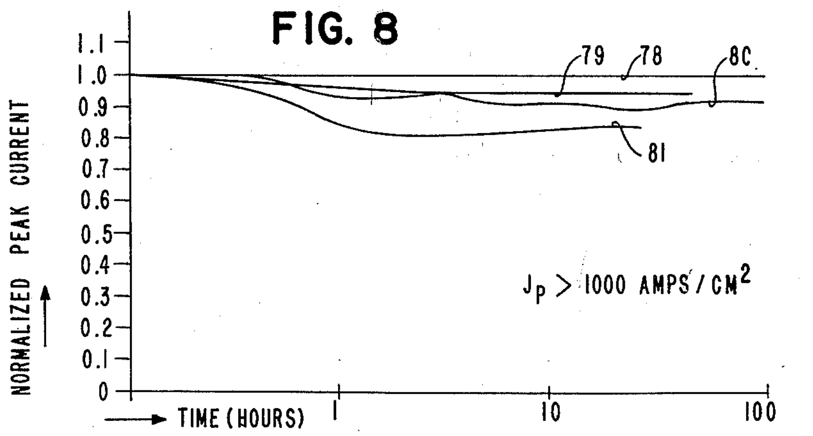

The results of operating life tests on tunnel diodes employing the teachings of the invention are shown in FIGURES 6–8 of the drawings. In all three graphs the normalized peak current (the peak current at point 13 measured at the start of a life test divided by the recorded value for the peak current at a particular time during the test) is plotted against operating time in hours. Each line on the graphs is designated by one of the reference numerals 70–81 and corresponds to a single tunnel diode. All of the operating life tests were performed at room temperature and under the same environmental conditions. The tunnel diodes were biased at operating points which varied between one and two times the peak current value depending upon the particular test. It should be understood that these graphs are initial test results on tunnel diodes constructed in accordance with the teachings of the invention.

The graph of FIGURE 6 is limited to those tunnel diodes having current densities (represented by the symbol $Jp$) of less than 500 amperes per square centimeter. The data for tunnel diodes whose current densities range between 500 and 1000 amperes per square centimeter is plotted on the graph of FIGURE 7. Similarly, the curves shown in FIGURE 8 are for those tunnel diodes having current densities which exceed 1000 amperes per square centimeter. Additional information concerning each of the tunnel diodes tested is given in the following table:

| Tunnel Diode No. | Initial Current Density (amps/cm.²) | Initial Peak to Valley Ratios | Initial Peak Current (milliamps) |
|---|---|---|---|
| 70 | 250 | 35 to 1 | 5.05 |
| 71 | 243 | 21 to 1 | 4.93 |
| 72 | 248 | 38 to 1 | 5.15 |
| 73 | 240 | 34 to 1 | 5.04 |
| 74 | 1,000 | 31 to 1 | 5.03 |
| 75 | 1,000 | 36 to 1 | 4.79 |
| 76 | 1,000 | 29 to 1 | 5.19 |
| 77 | 970 | 30 to 1 | 5.14 |
| 78 | 3,880 | 39 to 1 | 4.94 |
| 79 | 5,100 | 58 to 1 | 25.5 |
| 80 | 4,080 | 56 to 1 | 4.57 |
| 81 | 4,700 | 24 to 1 | 23.5 |

These graphs indicate that gallium arsenide tunnel diodes having current densities of several thousand amperes per square centimeter which do not fail during normal operation are provided. Very limited changes were observed in the valley currents of the tunnel diodes tested in compiling the graphs of FIGURES 6–8. From the data observed in testing over one hundred and fifty tunnel diodes, it was concluded that low current density tunnel diodes deteriorate slightly less than high current density units. However, many tunnel diodes having current densities as large as 5000 amperes per square centimeter show no noticeable deterioration after 100 hours of continuous operation.

It is not known exactly how the disclosed carrier-dopant alloy system operates to provide improved tunnel diodes. This is particularly true since others skilled in the art have concluded that copper with its high solubility and high diffusivity in heavily doped P-type gallium arsenide could cause localized junction, high field and/or high temperature migration problems within low temperature gallium arsenide tunnel diodes to destroy original junction charge density profiles and/or introduce excess tunneling centers. See, for example, Scientific Report No. 4*a*, dated March 28, 1961, prepared by the General Electric Company, Schenectady, New York, for the Electronics Research Directorate, Air Force Cambridge Research Laboratories, Office of Aerospace Research, Bedford, Massachusetts, under contract AF19(604)–6623. This report is available from the Armed Services Technical Information Agency, Arlington Hall Station, Arlington 12, Virginia, or the U.S. Department of Commerce, Office of Technical Services, Washington 25, D.C. In other words, it would appear that copper should not be included as a constituent for a carrier-dopant alloy for tunnel diodes and is possibly one of the main causes of failure in such devices.

However, it has been suggested that copper also substitutes for gallium in N-type gallium arsenide and provides a much more stable bond than in P-type gallium arsenide. The bond of copper in P-type gallium arsenide is thought to be largely interstitial in nature. The rapid regrowth at the liquidus interface may cause a large percentage of the copper to be rejected from the N-type regrowth region into the metallic region of the junction. If the above is true, then the copper would not be available or energetically able to migrate to the junction. The copper or other similar impurities in the gallium arsenide host crystal would not migrate as readily toward the junction since fewer gallium vacancies are present within the equilibrium N-type region. The equilibrium N-type region would already have a small content of indium and copper substituting in the gallium vacancies.

Regardless of the theory involved, the carrier-dopant alloy provides a means for fabricating gallium arsenide tunnel diodes in acceptable quantities and on a production basis having high peak to valley ratios and current densities which will not deteriorate in a short time during normal operation. Further, it has been observed that those tunnel diodes fabricated in accordance with the teaching of the invention which are going to fail as evidenced by a drastic reduction in the peak to valley ratios will do so very quickly. A convenient means is accordingly provided for selecting those diodes from a production batch having the desired stability and characteristics. The tunnel diodes tested in connection with the graphs of FIGURES 6–8 were separated from production batches in this manner.

The above described carrier-dopant alloy includes the impurity materials sulphur, selenium and tellurium. Tunnel diodes have been fabricated using the copper-indium alloy system having a trace of only one of these impurity materials. Any one of these three impurity materials when introduced in the alloy will dope the gallium arsenide host crystal sufficiently to produce a tunnel diode. However, tunnel diodes having the highest peak to valley ratios and current densities were fabricated using traces of all three of the impurity materials.

The copper-indium alloy system is, of course, not the only alloy system which can be employed in providing tunnel diodes. Silver has been substituted for the copper, and tunnel diodes have been produced with such a carrier-dopant alloy although these diodes did not exhibit the high current densities and low failure rates over long operating periods as was evidenced when the copper-indium alloy system was employed.

While the invention has been particularly shown and described with reference to a preferred embodiment thereof, it will be understood by those skilled in the art that the foregoing and other changes in form and details may be made therein without departing from the scope of the invention.

What is claimed is:

1. A tunnel diode having a pair of regions of the opposite conductivity type and a junction between said regions comprising:
   - a doped gallium arsenide host crystal with a carrier concentration of at least $5\times10^{19}$ per cubic centimeter providing one of said regions;
   - a carrier-dopant alloy providing the other of said regions; and
   - said carrier-dopant alloy consisting of 5–15% copper and 85–95% indium by weight and sufficient traces of sulphur, selenium and tellurium to accomplish degeneracy.

2. A tunnel diode having a pair of regions of the opposite conductivity type and a junction between said regions comprising:
   - a doped gallium arsenide host crystal with a carrier concentration of at least $5\times10^{19}$ per cubic centimeter providing one of said regions;
   - a carrier-dopant alloy providing the other of said regions; and
   - said carrier-dopant alloy consisting of indium and copper with the copper in effective amount to restrict spreading of indium during diffusion of the alloy in the host crystal, said alloy further consisting of sufficient traces of sulphur, selenium and tellurium to accomplish degeneracy.

References Cited by the Examiner

UNITED STATES PATENTS

| | | | |
|---|---|---|---|
| 2,833,678 | 5/58 | Armstrong et al. | 148—1.5 |
| 2,979,428 | 4/61 | Jenny et al. | 148—1.5 |
| 3,027,501 | 3/62 | Pearson | 148—1.5 X |
| 3,033,714 | 5/62 | Ezaki et al. | 148—33 |

OTHER REFERENCES

Fuller et al.: "Diffusion, Solubility and Electrical Behavior of Copper in Gallium Arsenide," J. Phy. Chem. Solids, vol. 6, August 1958, pages 173–177.

Hilsum: "Some Effects of Copper as an Impurities in Indium Arsenide," Proc. Phy. Soc., vol. 73, April 1959 (pages 685–686).

DAVID L. RECK, *Primary Examiner.*

RAY K. WINDHAM, *Examiner.*